United States Patent
Inoue et al.

[11] Patent Number: 6,153,893
[45] Date of Patent: *Nov. 28, 2000

[54] THIN FILM SEMICONDUCTOR DEVICE FOR DISPLAY

[75] Inventors: Yuko Inoue; Yukio Kinoshita; Hisao Hayashi, all of Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/764,308

[22] Filed: Dec. 12, 1996

Related U.S. Application Data

[63] Continuation of application No. 08/334,355, Nov. 3, 1994, abandoned.

[30] Foreign Application Priority Data

Nov. 5, 1993 [JP] Japan ................................. 05-301337

[51] Int. Cl.[7] ........................ H01L 29/786; H01L 29/04
[52] U.S. Cl. ............................. 257/72; 257/74; 257/408; 349/43
[58] Field of Search ................................. 257/72, 66, 74, 257/75, 408; 359/57, 59, 68, 67; 349/43, 46

[56] References Cited

U.S. PATENT DOCUMENTS

| | | | |
|---|---|---|---|
| 5,055,899 | 10/1991 | Wakai et al. ............................ | 257/72 |
| 5,182,620 | 1/1993 | Shimada et al. ....................... | 257/72 |
| 5,183,780 | 2/1993 | Noguchi et al. ....................... | 438/151 |
| 5,323,042 | 6/1994 | Matsumoto ............................ | 257/59 |
| 5,345,324 | 9/1994 | Koseki et al. .......................... | 359/67 |
| 5,371,398 | 12/1994 | Nishihara ............................... | 257/72 |
| 5,414,547 | 5/1995 | Matsuo et al. ......................... | 359/67 |

FOREIGN PATENT DOCUMENTS

| | | |
|---|---|---|
| 0 341 003 A2 | 11/1989 | European Pat. Off. . |
| 1128573 | 5/1989 | Japan ................................. 257/72 |
| 3167524 | 7/1991 | Japan ................................. 359/68 |
| 5-335580 | 12/1993 | Japan ................................. 257/408 |

OTHER PUBLICATIONS

Polysilicon Films and Interfaces, Symposium, vol. 106, Dec. 1–3, 1987, Boston USA, pp. 305–310, XP002035097, A. Chiang et al.
Patent Abstracts of Japan, vol. 9, No. 255, (E–349), Oct. 12, 1985.
JP 60 105274 A (Seiko Denshi Kogyo KK), Jun. 10, 1985.
Patent Abstracts of Japan, vol. 17, No. 586, (P–1633), Oct. 26, 1993.
JP 05 173179 A (Seiko Epson Corp.), Jul. 13, 1993.

*Primary Examiner*—John Guay
*Attorney, Agent, or Firm*—Hill & Simpson

[57] ABSTRACT

An LDD structure of a thin film transistor for pixel switching is realized on a large glass substrate by low-temperature processes. A thin film semiconductor device for display comprises a display part and a peripheral driving part formed on a glass substrate (0). Pixel electrodes (9) and NchLDD-TFTs are arranged in a matrix in the display part. Thin film transistor PchTFTs and NchTFTs which constitute circuit elements are formed in the peripheral driving part. Each thin film transistor consists of a gate electrode (1), an insulating film (2) formed on the gate electrode (1), a polycrystalline semiconductor layer (3) formed on the insulating layer (2), and a high concentration impurity layer constituting a source (4) and a drain (7) formed on the polycrystalline semiconductor layer (3). Further, an NchLDD-TFT thin film transistor for switching has an LDD structure in which a low concentration impurity layer (8) is interposed between the polycrystalline semiconductor layer (3) and the high concentration impurity layer (7).

19 Claims, 8 Drawing Sheets

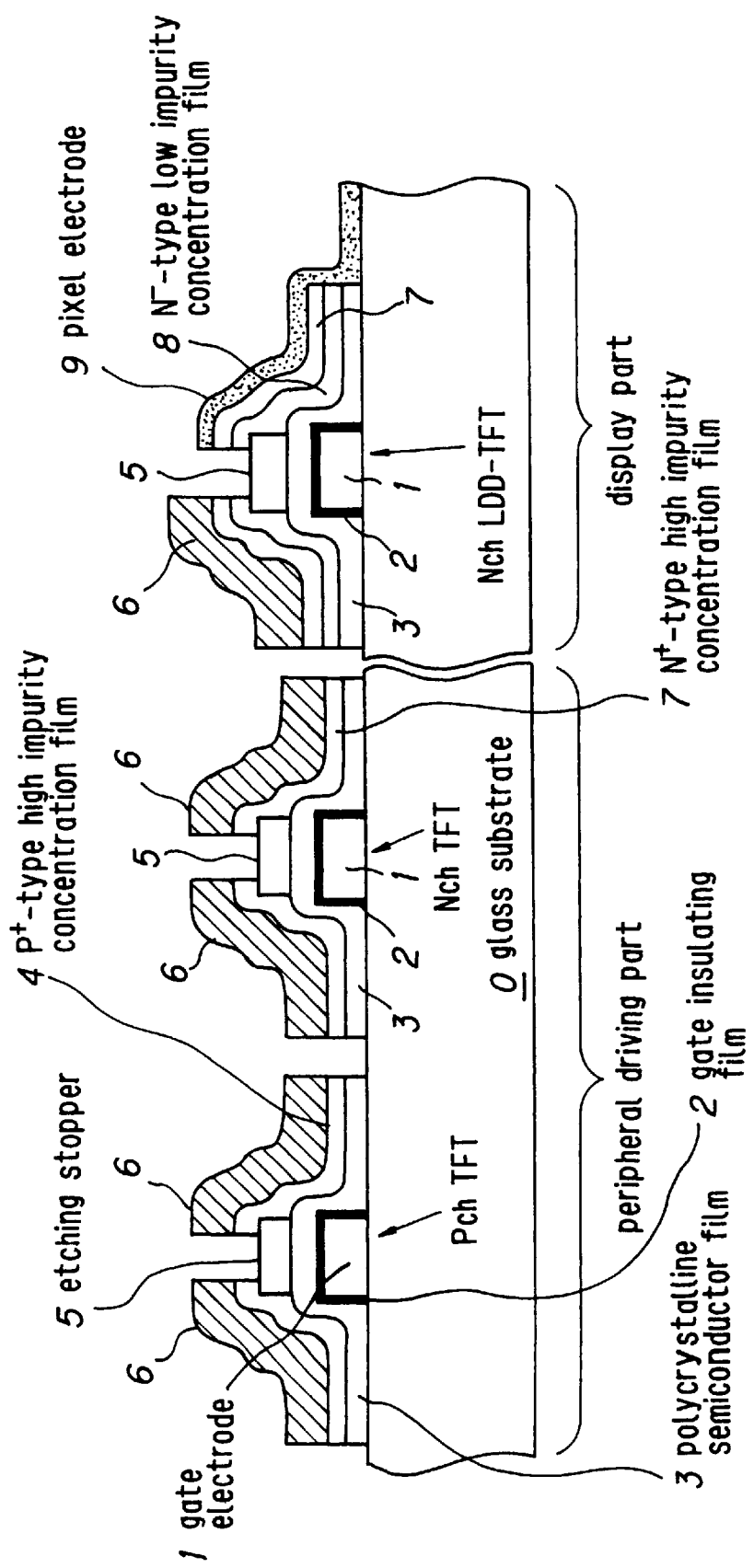

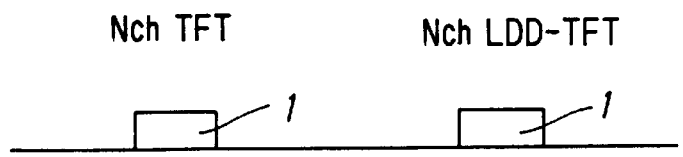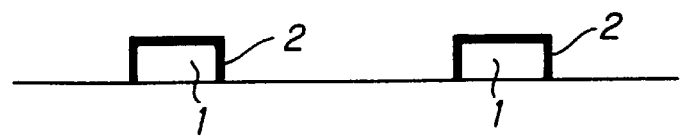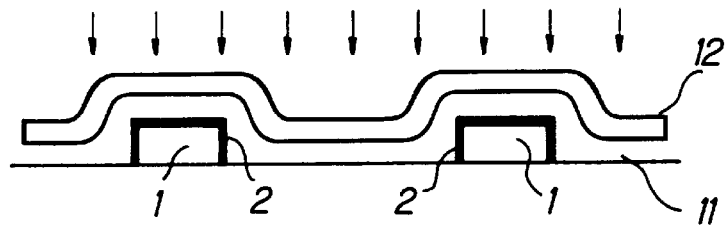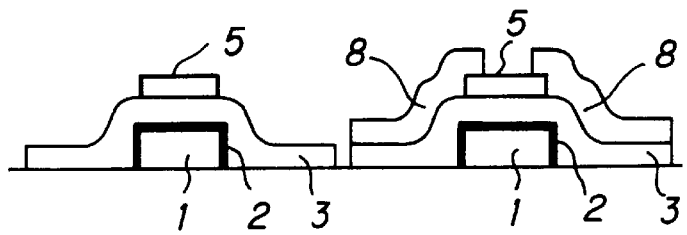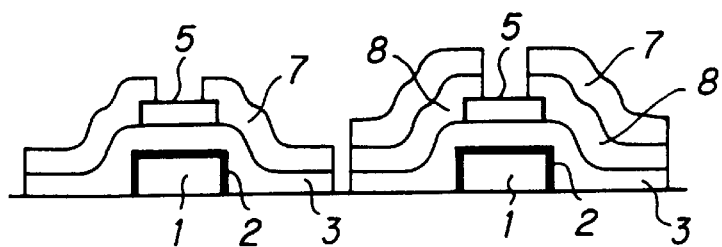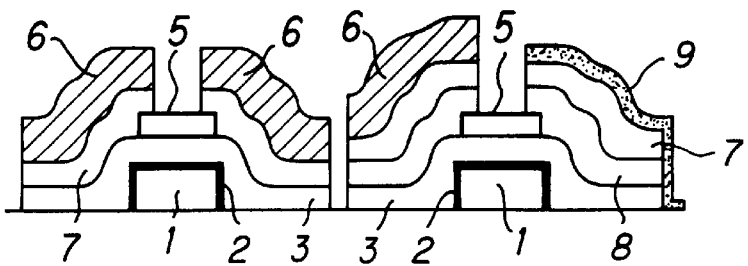

THIN FILM SEMICONDUCTOR DEVICE FOR DISPLAY

This is a continuation of application Ser. No. 08/334,355, filed Nov. 3, 1994, now abandoned.

BACKGROUND OF THE INVENTION

This invention relates to a thin film semiconductor device for display and a method of producing same, and in particular to a thin film semiconductor device for display used in a large active matrix liquid crystal display with a built-in peripheral driving part and a method of producing same.

First, a common construction of an active matrix liquid crystal display device will be briefly explained, with reference to FIG. 1. As shown in FIG. 1, this active matrix liquid display device has a flat panel structure comprising a main substrate (101), a opposed substrate (102) and a spacer (103) affixing the main substrate (101) to the opposed substrate (102), and liquid crystal is held between the two substrates. On the surface of the main substrate are formed a display part (106) consisting of pixel electrodes (104) and switching devices (105) for driving the pixel electrodes (104) arranged in a matrix, and peripheral driving parts (107) connected to the display part (106). The switching devices (105) consist of thin film transistors. Thin film transistors are also formed in the peripheral driving parts (107) as circuit elements. The main substrate (101) having the above-described constitution will hereinafter be called a "thin film semiconductor device for display".

In the field of thin film transistors (TFT) integratedly formed in thin film semiconductor devices for display, structures using semiconductor films made from polysilicon are now being developed intensively and have been applied to relatively small (a few inches) active matrix liquid display devices. However, because polysilicon TFTs are made by high temperature processes, quartz substrates, which have excellent heat resistance, have been used for them. On the other hand, for comparatively large active matrix liquid crystal display panels (ten or so inches to several tens of inches) quartz substrates are not suitable due to their high cost and consequently glass substrates are employed. When a glass substrate is used, because its heat resistance is inferior, amorphous silicon TFTs, which can be made by relatively low temperature processes, have been employed. However, amorphous silicon TFTs have low mobility and P-channel amorphous silicon TFTs cannot be made. As a result it is impossible to form a peripheral driving part on the glass substrate, and an externally attached driver device is used and mounted by the TAB method or the like. Consequently the number of pixels is restricted by the size of the screen and mounting limits. There therefore is a limit on how high-density thin film semiconductor devices for display using amorphous silicon TFTs can be made. Moreover, because an amorphous silicon TFT has low mobility, to obtain a sufficient ON-current the transistor size inevitably becomes large. Consequently the area of the display part occupied by the amorphous silicon TFTs for switching becomes large, and this is a hindrance to the realization of a high aperture ratio.

Recently, polysilicon TFTs with high mobilities which can be produced by low temperature processes have been being intensively developed. This technology involves converting an amorphous silicon film into a polysilicon film by locally heating the amorphous silicon film by annealing using an excimer laser. However, it is difficult for the processes other than the forming of the semiconductor films to be made low temperature processes and made performable with large substrates, and consequently this technology has not reached practical application. For example, one process which becomes problematic is that of forming the gate insulating layer. The gate insulating layers of current polysilicon TFTs are produced by thermally oxidizing polysilicon at approximately 1000° C. When the above thermal oxidation is replaced by some other method in which the film-forming process is carried out at a low temperature, the gate insulating film lacks a sufficient withstand voltage. Also, in order to build the peripheral driving devices in, to simultaneously build N-channel TFTs and P-channel TFTs, ion implanting of an impurity has been carried out, but an ion implantation apparatus which can handle large substrates has not been realized, and difficult problems arise. Plasma vapor phase diffusion apparatuses for use in place of ion implantation apparatuses are now being developed, but impurity control is difficult and their practical use for mass production has not been realized. In addition to the above, the most difficult problem is that it has not been possible to produce TFTs having an LDD structure (hereinafter called LDD-TFTs) by low temperature processes and without using ion implantation. LDD-TFTs are indispensable as thin film transistors for switching, and are employed in small active matrix liquid crystal display devices to prevent pixel leakage. However, it is extremely difficult at present to form LDD-TFTs by low temperature processes and without using ion implantation.

SUMMARY OF THE INVENTION

In view of the problems associated with the technology discussed above, it is an object of the present invention to provide an LDD-TFT structure and manufacturing method with which large thin film semiconductor devices for display can be made by low temperature processes. A second object is, in making larger displays, to achieve increases in the performance of polysilicon TFTs included in peripheral driving parts while maintaining the LDD-TFT structure of display parts, in order to enable the incorporation of peripheral driving parts. A third object of the present invention is, in making larger displays, to provide a method by which it is possible to produce a black mask and a color filter of on-chip construction in order to obtain high pixel density and a high aperture ratio.

In order to solve the problems associated with the technology discussed above and achieve the objects of the invention, the following means were devised: As the basic structure of the thin film semiconductor device for display of the present invention, there are provided a display part and a peripheral driving part formed integrally on a glass substrate. Pixel electrodes and thin film transistors for switching are arranged in a matrix in the display part. Thin film transistors to constitute circuit elements are formed in the peripheral driving part. Each thin film transistor is a bottom gate type comprising a gate electrode, a polycrystalline semiconductor layer formed on an insulating layer on the gate electrode, and a high concentration impurity film constituting a source and a drain formed on the polycrystalline semiconductor layer. The thin film transistors for switching are characterized in that they have an LDD structure wherein a low concentration impurity film is interposed between the polycrystalline semiconductor layer and the high concentration impurity film.

Preferably, the display part comprises an upper side part including the pixel electrodes, a lower side part including the thin film transistors for switching, and a color filter layer, a black mask layer and a planarization layer interposed between the two. In this case, the black mask layer contains a metal wiring pattern electrically connected to the high concentration impurity layer for the source and drain. Also, the pixel electrodes are electrically connected via the metal wiring pattern to the high concentration impurity film for the drain.

A film semiconductor device for display having the above-described constitution can be manufactured by the following low temperature processes: First, gate electrodes are formed on a glass substrate. Next, a semiconductor thin film is formed on an insulating film on the gate electrodes and then the semiconductor thin film is transformed into a polycrystalline layer by laser annealing. A low concentration impurity layer is then selectively formed only on the polycrystalline semiconductor layer included in the display part. Further, a high concentration impurity layer for sources and drains is formed on the low concentration impurity film, and thin film transistors for switching having a stacked LDD structure are thereby formed. At the same time, thin film transistors to be circuit elements are formed by directly forming a high concentration impurity layer for sources and drains on the polycrystalline semiconductor layer included in the peripheral driving part. Preferably, additional laser annealing is selectively performed on the high concentration impurity layers included in the peripheral driving part in order to reduce the resistance of the polycrystalline semiconductor layer.

According to this invention, after gate electrodes are formed on a glass substrate a semiconductor film is formed at low temperature on a gate insulating film on the gate electrodes. After that, the semiconductor thin film is transformed into a polycrystalline semiconductor layer by laser annealing. In this way it is possible to form a polycrystalline thin film transistor by low temperature processes. Because it is a bottom gate type, this structure does not readily suffer adverse influences from impurities such as sodium contained in the glass substrate. Also, because a polycrystalline semiconductor layer is used as the device region, it is possible to make the TFT small. In particular, in the thin film transistors for pixel switching, an LDD structure can be realized by forming a low concentration impurity layer and a high concentration impurity layer on the polycrystalline semiconductor layer by low temperature processes. In this way, pixel leakage and the like, which would be fatal defects in a display device, can be effectively prevented. In the thin film transistors constituting circuit elements of the peripheral driving part, on the other hand, N-channel TFTs and P-channel TFTs can be formed at the same time by superposing a high concentration impurity layer on the polycrystalline semiconductor layer by low temperature processes, and building-in of the driver is realized. At this time, additional laser annealing is selectively performed on the thin film transistors included in the peripheral driving part to increase the speed of these TFTs. In addition, by adopting an on-chip structure of a color filter layer, a black mask layer and a planarization layer, the invention contributes to higher pixel density and higher aperture rates.

BRIEF DESCRIPTION OF THE DRAWINGS

FIG. 2 is a sectional view of a first preferred embodiment of the invention;

FIGS. 3(A) through 3(F) are sectional views illustrating steps in a process for manufacturing the first preferred embodiment of the invention;

DETAILED DESCRIPTION OF THE PREFERRED EMBODIMENTS

Figure 1:
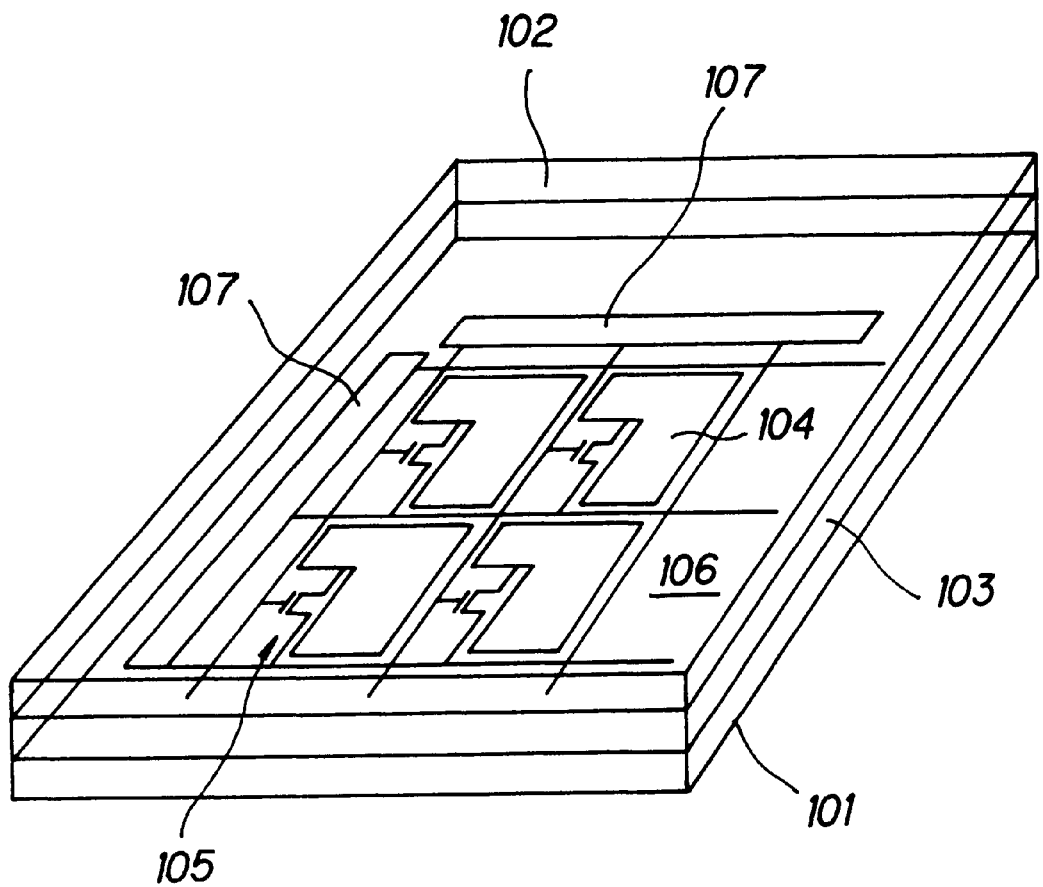
FIG. 1 is a perspective view of a general structure of a conventional active matrix liquid crystal display device.

Preferred embodiments of the invention will now be explained with reference to the accompanying drawings. FIG. 2 is a schematic partial sectional view of a first preferred embodiment of the film semiconductor device for display of this invention. This device is provided with a display part and a peripheral driving part which are integrally formed on a glass substrate (0). In the display part, pixel electrodes (9) and thin film transistors for switching are formed in a matrix. In this embodiment, these thin film transistors (TFTS) are N-channel type thin film transistors of LDD structure (hereinafter called NchLDD-TFTs). On the other hand, in the peripheral driving part there are formed thin film transistors constituting circuit elements. In this embodiment, to simplify the drawings, one pair of transistors consisting of an N-channel type thin film transistor (NchTFT) and a P-channel type thin film transistor (PchTFT) is shown.

A gate electrode (1) is patterned on the glass substrate (0) in a predetermined shape for each of the TFTs. This gate electrode is made from a metal such as for example Ta, Ti, Cr, Mo/Ta, Al, or Cu. A gate insulating film (2) consisting of a metal oxide is formed on the gate electrode (1). In the PchTFT and the NchTFT of the peripheral driving part, a polycrystalline semiconductor layer (3) made from pure polysilicon is formed on the gate insulating film (2). In the case of the PchTFT, a P+ type high concentration impurity layer (4) is further formed on the polycrystalline semiconductor layer (3). In the case of the NchTFT, an N+ type high concentration impurity layer (7) is formed on the polycrystalline semiconductor layer (3). In both cases, the high concentration impurity layer is divided into two by an etching stopper (5) made from $SiO_2$, and the divided parts become sources and drains. Wiring layers (6) are connected to these sources and drains.

The NchLDD-TFT formed in the display part has the same structure as the NchTFT of the peripheral driving part in so far as a polycrystalline semiconductor layer (3) consisting of pure polysilicon is formed on a gate insulating film (2) on a gate electrode (1). In the NchLDD-TFT of the display part, an N-type low concentration impurity layer (8) consisting of N-type silicon is deposited on the polycrystalline semiconductor layer (3), and an $N^+$-type high concentration impurity layer (7) consisting of $N^+$-type silicon is deposited on the N-type low concentration impurity layer (8). These two silicon layers superposed in the order N-, $N^+$-constitute an LDD structure, and suppress the OFF-current of the NchLDD-TFT. Finally, a wiring layer (6) made from aluminum or the like is connected to the source side of the NchLDD-TFT, and a pixel electrode (9) made from a transparent conductive film such as ITO is connected to the drain side.

A method of producing the thin film semiconductor device shown in FIG. 2 will now be explained in detail with reference to FIG. 3. In this preferred embodiment, the NchLDD-TFTs of the display part and the NchTFTs of the peripheral driving part are simultaneously formed on the glass substrate by low temperature processes and without using ion implantation. First, in step (A), gate electrodes (1) are patterned on a glass substrate. Here, Mo/Ta is used as the gate electrode material. Next, in step (B), $Ta_2O_5$ is formed by anodic oxidation to a constitute gate insulating film (2). Such oxide films produced by anodic oxidation have good interface condition and uniformity and therefore are excellent as gate insulating films. Next, in step (C), an amorphous silicon film (11) and an $SiO_2$ film (12) are formed, in that order. The whole surface is then annealed with an excimer laser, whereby the amorphous silicon 11 is polysiliconized. Next, in step (D), the $SiO_2$ film (12) and the polysiliconized semiconductor thin film are patterned and processed into etching stoppers (5) and polycrystalline semiconductor layers (3) respectively. Further, an N-type silicon low concentration impurity layer (8) is formed by the P-CVD method on the TFT belonging to the display part. In the next step (E), an N+ type silicon high concentration impurity layer (7) is formed by the P-CVD method. The NchTFT of the peripheral driving part side and the NchLDD-TFT of the display part side can be formed at the same time by these steps. When forming the PchTFTs on the peripheral driving part side, a P+ type high concentration impurity layer (4) is formed instead of the N+ type high concentration impurity layer (7). In the last process (F), wiring layers (6) and pixel electrodes (9) are formed. By such steps as these, the three sorts of transistors that are the PchTFT, NchTFT and NchLDD-TFT can be formed on the same glass substrate at low temperature and without using ion implantation. Therefore, it is possible to produce a thin film semiconductor device for display with a built-in driver of which the thin film transistor for pixel switching has an LDD structure.

A second preferred embodiment of the film semiconductor device for display of this invention will be described with reference to FIG. 4. Before this description, to facilitate understanding of this preferred embodiment its background will be briefly explained. For manufacturing cost reasons, active matrix liquid crystal display devices with built-in drivers have only been commercialized as small displays, such as those used for viewfinders. Consequently, the number of pixels has been about 300,000 pixels at most. However, as shown in the first preferred embodiment it is possible to produce a thin film semiconductor device for display with a built-in driver using a large glass substrate. Active matrix liquid crystal displays for VGA (480×640×3 pixels) are the main relatively large matrix liquid crystal display panels used for current portable personal computers and word processors, etc. If this active matrix liquid display panel were to be given a driver-on-chip structure, thinking simply, three times the speed would be necessary compared to a horizontal driver incorporated in a small (300,000 pixel full line) display. In this point, there is a possibility that the thin film transistors of the first preferred embodiment shown in FIG. 2 could not be made fast enough. The performance of a thin film transistor is generally improved by activating impurities by annealing at high temperature. When a glass substrate is used, however, it is not possible to carry out such high temperature annealing. Also, if the activating treatment were to be carried out by laser annealing all the TFTs, there is a danger of the LDD structure of the TFTs formed as pixel switching devices disappearing due to diffusion. In view of this problem, this preferred embodiment has as an object the formation of higher-performance thin film transistors in the peripheral driving part while maintaining the LDD structure of the thin film transistors for pixel switching.

Figure 4:
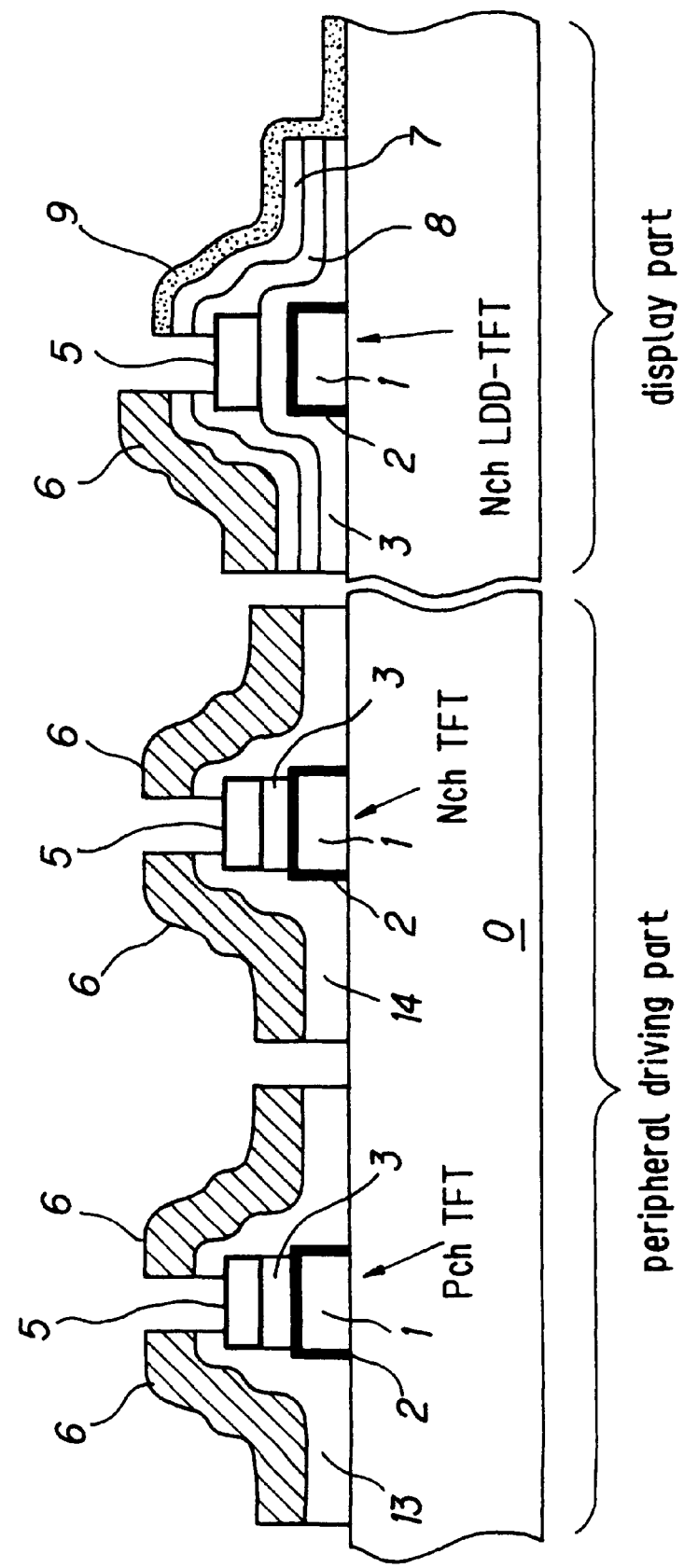
FIG. 4 is a sectional view of a second preferred embodiment of the invention.
Figure 5A:
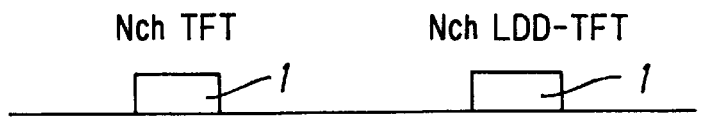
FIGS. 5(A) through 5(G) are sectional views illustrating steps in a process for manufacturing the second preferred embodiment of the invention.
Figure 5B:
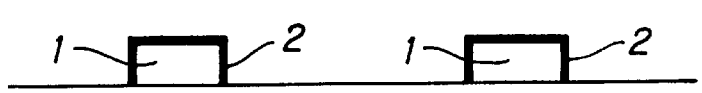
Figure 5C:
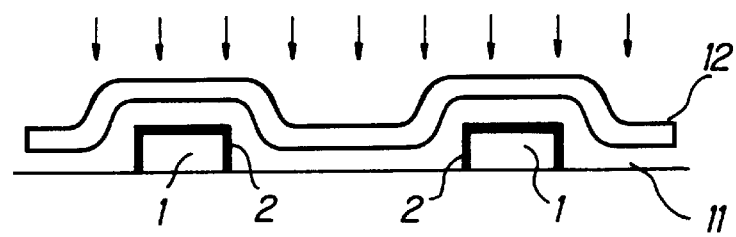
Figure 5D:
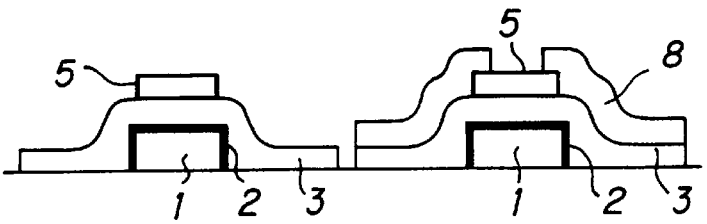
Figure 5E:
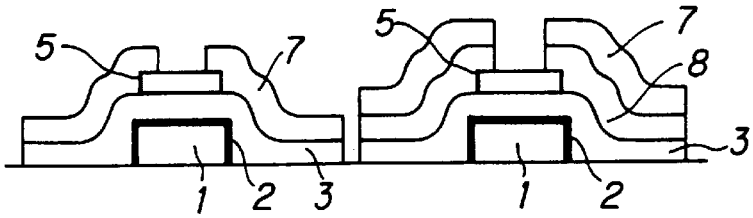
Figure 5F:
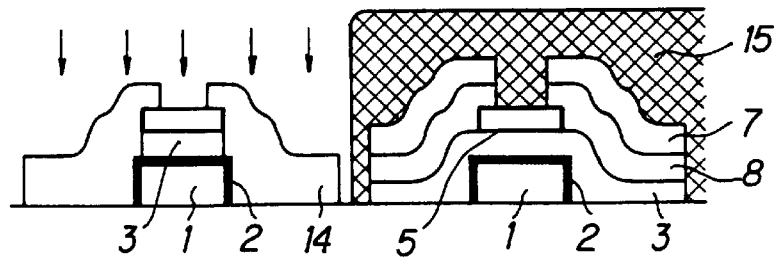
Figure 5G:
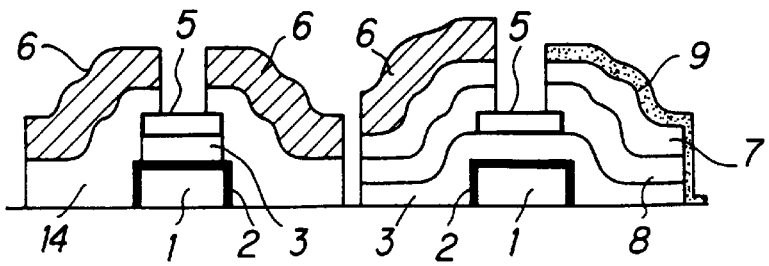

As shown in FIG. 4, this second preferred embodiment has basically the same structure as the first preferred embodiment shown in FIG. 2. Accordingly, to facilitate understanding, corresponding parts have been given the same reference numbers. A point of difference is the composition of the polycrystalline semiconductor layer of the PchTFT and NchTFT formed in the peripheral driving part. In the first preferred embodiment, the polycrystalline semiconductor layer (3) is made from pure polysilicon. In this second preferred embodiment, however, the polycrystalline semiconductor layer (13) of the PchTFT is made from P+ type polysilicon. Consequently, the polycrystalline semiconductor layer of the second preferred embodiment has a lower resistivity than that of the first preferred embodiment, and higher speed operation is possible. The pure polysilicon is only left between the gate insulating film (2) and the etching stopper (5). Similarly, the polycrystalline semiconductor layer (14) of the NchTFT is made from N+ type polysilicon in order to have a low resistivity. Again, the pure polysilicon remains only between the gate insulating film (2) and the etching stopper (5).

A method of producing the second preferred embodiment shown in FIG. 4 will now be described with reference to FIG. 5. As is apparent from comparison with the manufacturing method of the first preferred embodiment shown in FIG. 3, steps (A) to (E) are exactly the same. However, in this preferred embodiment, after step (E), selective laser annealing is carried out in step (F). That is, the pixel switching device NchLDD-TFTs are covered with a resist (15) and the NchTFTs included in the peripheral driving part are annealed with an excimer laser. As a result, the polycrystalline semiconductor layer (3) made from pure polysilicon and the high concentration impurity layer (7) made from N+ type polysilicon formed thereon are fused to each other and are made N type in all parts except for the channel regions. Consequently, pure polysilicon is left in the channel regions, and all other parts are converted into a polycrystalline semiconductor layer (14) comprising N+ type polysilicon, lowering their resistivity. The ON-current of the NchTFT consequently increases, and the NchTFT becomes able endure high speed operation. Further, by selectively laser-annealing only the thin film transistors of the peripheral driving part, the LDD structure of the NchLDD-TFT for pixel switching consisting of the low concentration impurity layer (8) and the high concentration impurity layer (7) is maintained. After that, in step (G), wiring layers (6) and pixel electrodes (9) are formed on the high concentration impurity layers (7), and the film semiconductor device for display shown in FIG. 4 is obtained. The additional laser annealing shown in step (F) is also carried out on the PchTFTs.

A third preferred embodiment of the film semiconductor device for display of this invention will now be explained in detail with reference to FIG. 6. First, the background of the third preferred embodiment will be briefly explained. In the first and second preferred embodiments shown in FIG. 2 and FIG. 4, the surfaces of the film semiconductor devices for display are made very uneven by the TFTs and the wiring layers. Consequently, when the film semiconductor device for display is assembled into a liquid crystal panel, it may be difficult to control the orientation of the liquid crystal, and uniform orientation and pixel ON/OFF control may be problematic. One conceivable countermeasure to this is to screen the thin film transistors and the wiring layers (and also supplementary capacities) with black masks positioned on the facing substrate side, to prevent the display quality from decreasing. However, this method is extremely disadvantageous from the point of view of increasing pixel density, because the width of the black mask cannot be reduced. Further, with this method, to increase the aperture ratio, supplementary capacities are formed below the wiring layers comprising aluminum or the like. In the case of the bottom gate structure, however, the wiring layer and the polycrystalline semiconductor layer short-circuit with each other, and this structure cannot be adopted without an insulating film. Also, when black masks are placed on the facing substrate side it is necessary to provide a margin in consideration of alignment errors, and consequently the aperture ratio is decreased. To solve the above-mentioned problems, an object of this third preferred embodiment is to form a color filter layer, a black mask layer and a planarization layer on-chip, in addition to the structures shown in the first and second preferred embodiments.

Figure 6:
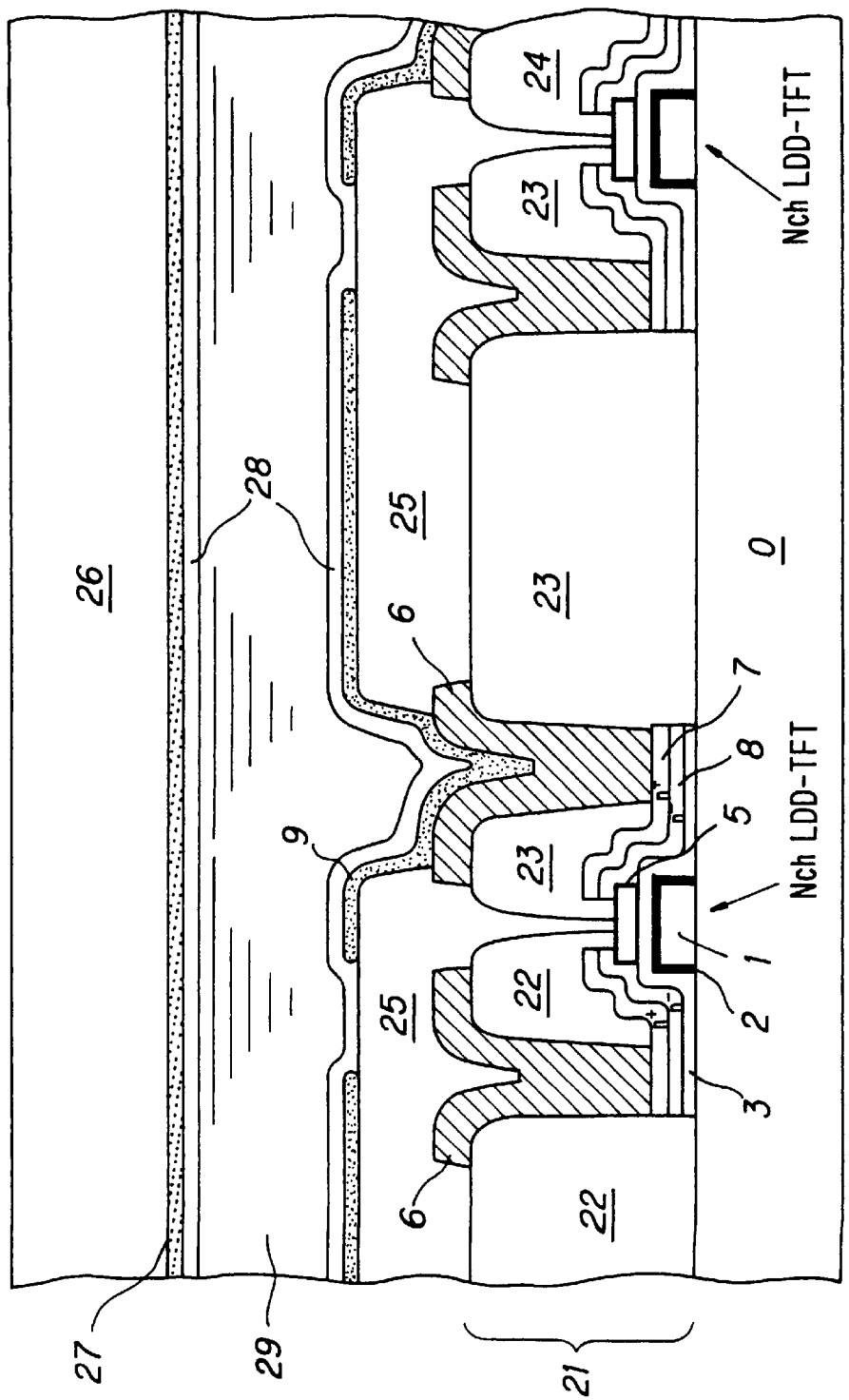
FIG. 6 is a sectional view of a third preferred embodiment of the invention.
Figure 7A:
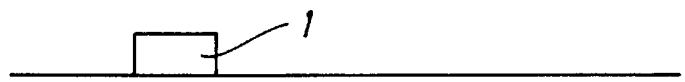
FIGS. 7(A) through 7(H) are sectional views illustrating steps in a process for manufacturing the third preferred embodiment of the invention.
Figure 7B:
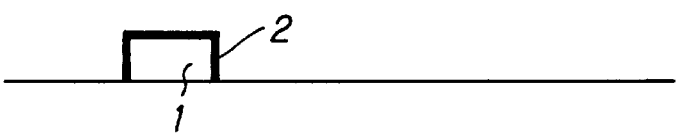
Figure 7C:
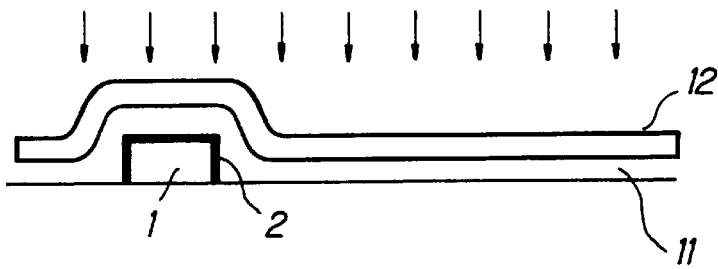
Figure 7D:
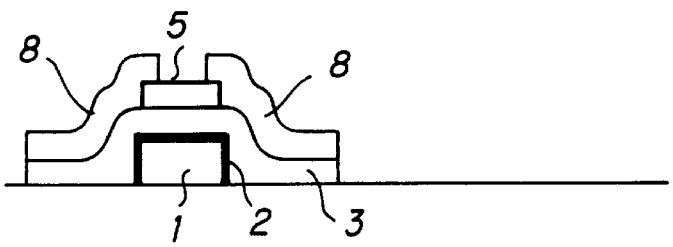
Figure 7E:
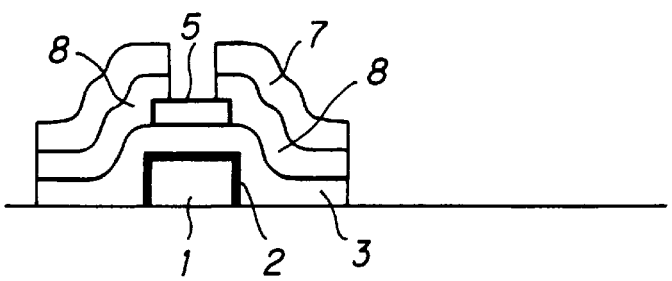
Figure 7F:
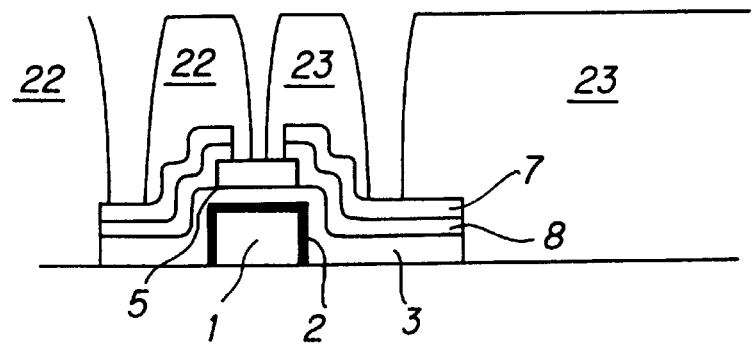
Figure 7G:
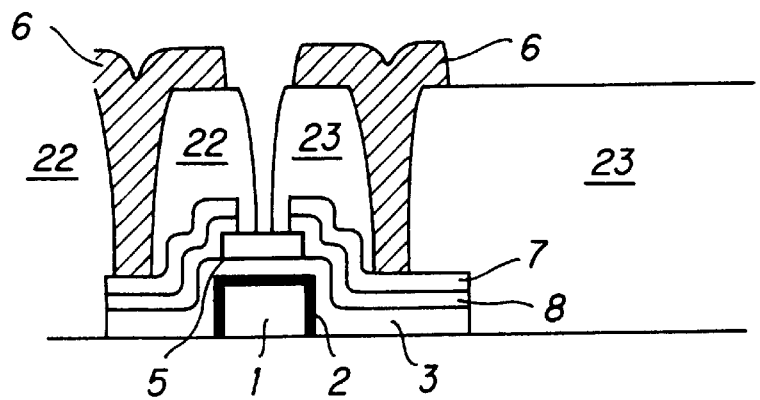
Figure 7H:
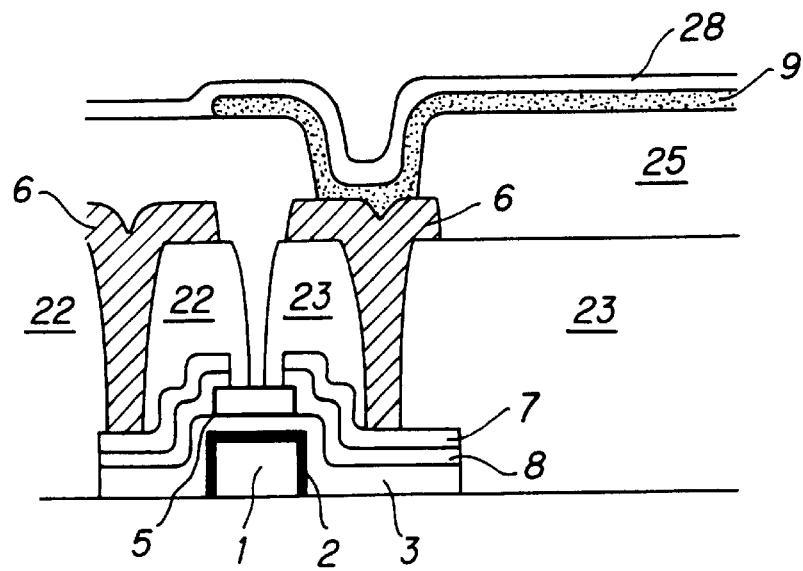

FIG. 6 is a partial sectional view of two pixels of a structure in which the thin film semiconductor device for display of the third preferred embodiment is built into an active matrix liquid crystal display panel. A gate electrode (1) is formed on a glass substrate (main substrate) (0) constituting a thin film semiconductor device for display. This gate electrode is made from a metal such as Ta, Ti, Cr, Mo/Ta, Al, or Cu. A gate insulating film (2) is created by forming a metal oxide on the gate electrode. A polycrystalline semiconductor layer (3) comprising pure polysilicon is formed on the gate insulating film (2). Further, a low concentration impurity layer (8) comprising N-type silicon is formed on the polycrystalline semiconductor layer (3), and a high concentration impurity layer (7) comprising N+ type polysilicon is formed on the N-type layer (8) as a drain and a source. This two-layer structure consisting of N-type polysilicon and N+-type polysilicon constitutes an LDD and suppresses the OFF-current of the NchLDD-TFT. The NchLDD-TFT described above is included in a lower side part. On the other hand a pixel electrode (9) is provided in an upper side part. A color filter layer, a black mask layer and a planarization layer are interposed between the lower side part and the upper side part. The color filter layer (21) includes segments (22), (23) and (24) assigned to the three primary colors RGB in correspondence with the pixels. A metal wiring layer (6) to constitute signal wires is formed on the color filter layer (21). The metal wiring layer (6) and the gate lines including the gate electrodes (1) constitute a black masks layer. Hence, the metal wiring layer (6) is also provided in the contact hole on the pixel electrode (9) side. Because as it is there are differences in the height on the surface of the glass substrate, a planarization layer (25) is further formed. The above-mentioned pixel electrode (9) is formed on the planarization layer (25), and is electrically connected to the drain of the NchLDD-TFT via the metal wiring layer (6). In this third preferred embodiment, the color filter layer (21) and the black mask layer are formed on the main substrate (glass substrate) (0) side, on-chip, and only a facing electrode (27), consisting of a transparent conductive film, is formed on the facing substrate (26). Orientation films (28) are formed on the inner surfaces of the main and facing substrates (0) and (26). After these orientation films (28) are processed by rubbing, the two substrates (0) and (26) are affixed to each other, liquid crystal (29) is charged and sealed in a clearance between them, and a large active matrix liquid crystal display panel is obtained.

As explained above, the unevenness of the main substrate (0) is reduced by forming the planarization layer (25) thereon, reverse tilt domains are eliminated, and the width of the black masks can be minimized. Furthermore, it is possible to suppress variation in the thickness of the orientation films (28) and orientation defects during the rubbing treatment. By using the color filter layer (21) as an insulating layer and wiring for example aluminum thereon, it is possible to build in supplementary capacity thereunder. The alignment precision with respect to the facing substrate (26) side can be greatly eased by making the color filter layer and the black mask layer on the main substrate (0). Furthermore, since the NchLDD-TFT uses the polycrystalline semiconductor layer (3) comprising polysilicon as a device region, the size of the transistor can be reduced. The aperture ratio of the active matrix liquid crystal display panel is improved for the above reasons. As a result, the consumed power of the whole display including the back light is lowered.

A method of producing the third preferred embodiment shown in FIG. 6 will now be explained with reference to FIG. 7. First, gate electrodes (1) are patterned on a glass substrate in step (A). Here, Mo/Ta is used as the metal material of the gate electrodes (1). Next, in step (B), $Ta_2O_5$ is formed by anodic oxidation to constitute a gate insulating film (2). Such an oxide produced by anodic oxidation has good interface condition and uniformity and is excellent as the gate insulating film (2). In the next step (C), a silicon film (11) and an $SiO_2$ film (12) are formed in order, and then the silicon film (11) is converted into a polysilicon film by annealing with an excimer laser. In step (D) the $SiO_2$ film (12) and the polysilicon film are patterned into predetermined shapes to form an etching stopper (5) and polycrystalline semiconductor layers (3), respectively. Further, a low concentration impurity layer (8) comprising N-type silicon is deposited on the polycrystalline semiconductor layer (3) by the CVD method. Then, in step (E), a high concentration impurity layer (7) comprising N+ type silicon is formed.

Next, in step (F), segments (22), (23) and (24) of the color filter film (21) colored in the three primary colors RGB are respectively patterned. Further, contact holes passing through the sources and drains of the NchLDD-TFTs are formed. In step (G), wiring layers (6) to constitute a black mask are patterned in metal. Finally, in step (H), planarization layers (25) are formed. Pixel electrodes (9) are patterned on the planarization layers (25). Orientation films (28) are deposited so as to cover the pixel electrodes (9). By the above process it is possible to form a thin film transistor, a color filter layer, a black mask layer and a planarization layer on the glass substrate with low temperature processes and without using ion-implantation. If polysilicon TFTs can be made on a large glass substrate, it is possible to make built-in drivers. Further, since the thin film transistors for pixel switching can be made small, the aperture ratio rises. In addition, the aperture ratio is further increased by incorporating color films and black mask layers. The improvement of the aperture ratio contributes to the reduction of consumed power of the whole display including the back light. This merit is very useful for prolonging battery life when the device is used in portable information apparatuses such as handy-terminals.

As a supplement, specific examples will be given with regard to the compositions, film thicknesses, and manufacturing methods of the constituent elements, with reference to step (H) in FIG. 7. The gate electrode (1) is formed by for example sputtering a Mo/Ta alloy to a thickness about 200 nm. The gate insulating film (2) is made from for example anodically oxidized $Ta_2O_5$ of a thickness of about 230 nm. The polycrystalline semiconductor layer (3) is obtained by laser-annealing a film of amorphous silicon having a thickness of for example 100 nm formed by plasma CVD. The low concentration impurity layer (8) is made by forming an N− type amorphous silicon film having a thickness of for example 50 nm by plasma CVD. Further, the high concentration impurity layer (7) is made for example by accumulating an N+ type amorphous silicon to a 100 nm thickness by the plasma CVD method. The etching stopper (5) is obtained for example by accumulating SiO$_2$ to a 200 nm thickness by the plasma CVD method and patterning it into a predetermined shape. The segments (22), (23) and (24) of the color filter layer are formed by the pigment dispersion method to a 1500 nm thickness. The metal wiring layer (6) is for example made from Mo to a 240 nm thickness by sputtering and patterned into a predetermined shape. The planarization layer (25) is for example made by coating a transparent resist to a 1000 nm thickness. The pixel electrode (9) is for example made from ITO of 50 nm thickness by sputtering and patterning into a predetermined shape. The orientation films (28) are made by coating polyimide to thickness 80 nm with a roll coater.

As explained above, according to this invention, it is possible to polycrystallize amorphous silicon by laser annealing and produce N-channel transistors, P-channel transistors and transistors having an LDD structure with low temperature processes and without using ion implantation. As a result it is possible to produce a film semiconductor device for display having a built-in driver using a large glass substrate, and reductions in production cost, increases in pixel density, and increases in the efficiency of active matrix liquid crystal display panels can be realized. Further, by selectively annealing just the thin film transistor in the peripheral driving part, higher-performance transistors can be made in the peripheral driving part and the speed of the driver can thereby be increased while maintaining the LDD structure of the transistors used as switching devices. Consequently it is possible to increase the number of pixels in a large liquid crystal display panel having a built-in driver. Further, by making color filters and black masks in addition to polysilicon transistors on the glass substrate, the aperture ratio of the liquid crystal display panel is improved and reduced electricity consumption of a display module including the back light is realized.

What is claimed is:

1. A thin film semiconductor device, comprising:
   a glass substrate;
   a display part formed on the glass substrate, said display part comprised of a plurality of pixel electrodes and pixel transistors each of which is associated with respective ones of the pixel electrodes;
   a peripheral drive circuit part formed on the same glass substrate, said peripheral drive circuit part comprising CMOS transistors;
   each of the pixel transistors and CMOS transistors comprising a gate electrode formed directly on the glass substrate, a substantially pure polycrystalline semiconductor layer on the gate electrode over a gate insulating layer, and a high concentration impurity layer having a metal layer in the case of the CMOS transistors or a pixel electrode layer or a metal layer in the case of the pixel transistors thereon over the pure polycrystalline semiconductor layer forming source/drain regions, and wherein said gate insulating layer is formed of an anodic oxidation metal oxide; and
   the pixel transistors being of an LDD structure wherein a low concentration impurity layer is formed between the substantially pure polycrystalline semiconductor layer and the high concentration impurity layer.

2. A thin film semiconductor device according to claim 1, wherein the display part further comprises an upper region containing the pixel electrodes, a lower region containing the pixel transistors, and a planarization layer disposed between the upper and lower regions.

3. A thin film semiconductor device according to claim 2, further comprising a color filter layer and a black mask layer between the upper and lower regions.

4. A thin film semiconductor device according to claim 3, wherein the black mask layer contains a metal wiring pattern electrically connected to the high concentration impurity layer.

5. A thin film semiconductor device according to claim 4, wherein the pixel electrodes are electrically connected to the high concentration impurity layer by way of the metal wiring pattern.

6. A thin film semiconductor device according to claim 1, wherein said substantially pure polycrystalline semiconductor layer of the respective CMOS transistors has the same shape as that of the respective pixel transistors.

7. A thin film semiconductor device according to claim 1, wherein said substantially pure polycrystalline semiconductor layer is formed only over the gate electrode of the CMOS transistors.

8. The thin film semiconductor device of claim 1, wherein the high concentration impurity layers of at least some of the pixel transistors and some of the cmos transistors are formed of a same doped layer.

9. A liquid crystal display device, comprising:
   a glass substrate;
   a display part formed on the glass substrate, said display part comprised of a plurality of pixel electrodes and pixel transistors associated with the respective pixel electrodes;
   a peripheral drive circuit part formed on the same glass substrate, said peripheral drive circuit comprised of CMOS transistors;
   each of the pixel transistors and CMOS transistors comprising a gate electrode formed directly on the glass substrate, a substantially pure polycrystalline semiconductor layer formed on an insulating film on the gate electrode, and a high concentration impurity layer having a metal layer in the case of the CMOS transistors or a pixel electrode layer or a metal layer in the case of the pixel transistors thereon over the pure polycrystalline semiconductor layer forming source/drain regions, and wherein said gate insulating layer is formed of an anodic oxidation metal oxide;
   the pixel transistors being of an LDD structure wherein a low concentration impurity layer is interposed between the substantially pure polycrystalline semiconductor layer and the high concentration impurity layer;
   an opposed substrate disposed facing the glass substrate; and
   a liquid crystal layer held between the glass substrate and the opposed substrate.

10. A liquid crystal display device according to claim 9, wherein the display part comprises an upper region containing the pixel electrodes, a lower region containing the pixel transistors, and a planarization layer disposed between the upper and lower regions.

11. A thin film semiconductor device according to claim 10, further comprising a color filter layer and a black mask layer between the upper and lower regions.

12. The thin film semiconductor device of claim 9, wherein the high concentration impurity layers of at least some of the pixel transistors and some of the cmos transistors are formed of a same doped layer.

13. A thin film semiconductor device, comprising:

a glass substrate;

a display part formed on the glass substrate, said display part comprised of a plurality of pixel electrodes and pixel transistors each of which is associated with respective ones of the pixel electrodes;

a peripheral drive circuit part formed on the glass substrate, said peripheral drive circuit part comprising CMOS transistors;

each of the pixel transistors and CMOS transistors comprising a gate electrode formed on the glass substrate, and a substantially a pure polycrystalline semiconductor layer on the gate electrode over a gate insulating layer, and a high concentration impurity layer forming source/drain regions;

the pixel transistors being of an LDD structure wherein a low concentration impurity layer is formed between the substantially pure polycrystalline semiconductor layer and the high concentration impurity layer; and said substantially pure polycrystalline semiconductor layer is formed only over the gate electrode of the CMOS transistors.

14. A display device, comprising:

a glass substrate;

a display portion formed on the glass substrate, said display portion comprised of a plurality of pixel electrodes and pixel transistors associated with the respective pixel electrodes for switching and formed in a matrix;

a peripheral drive circuit portion formed on the same glass substrate, said peripheral drive circuit comprising CMOS transistors;

each of the pixel transistors and CMOS transistors comprising a gate electrode formed directly on the glass substrate, an insulating layer formed on the gate electrode, a substantially pure polycrystalline semiconductor layer on the insulating layer and a high concentration impurity layer having a metal layer in the case of the CMOS transistors or a pixel electrode layer or a metal layer in the case of the pixel transistors thereon over the pure polycrystalline semiconductor layer forming source/drain regions; and wherein said gate insulating layer is formed of an anodic oxidation metal oxide; and the pixel transistors are further comprised of an LDD structure wherein a low concentration impurity layer is formed between the substantially pure polycrystalline semiconductor layer and the high concentration impurity layer.

15. The display device of claim 14, wherein the gate electrode is comprised of Ti.

16. The display device of claim 14, wherein the gate electrode is comprised of Cu.

17. The display device of claim 14, wherein the display portion is further comprised of an upper region containing pixel electrodes, a lower region containing the pixel transistors and a planarization layer formed between the upper and lower regions.

18. The display device of claim 15, wherein the display device further comprises a color filter layer and a black mask layer between the upper and lower regions.

19. The display device of claim 18, wherein the black mask layer further comprises a metal wiring pattern electrically connected to the high concentration impurity layer.

* * * * *